United States Patent [19]

Waller, Jr.

[11] Patent Number: 5,493,617
[45] Date of Patent: Feb. 20, 1996

[54] FREQUENCY BANDWIDTH DEPENDENT EXPONENTIAL RELEASE FOR DYNAMIC FILTER

[76] Inventor: James K. Waller, Jr., 741 Morgan Hill, Lake Orion, Mich. 48035

[21] Appl. No.: 255,838

[22] Filed: Jun. 7, 1994

Related U.S. Application Data

[63] Continuation of Ser. No. 28,762, Mar. 9, 1993, abandoned, and a continuation of Ser. No. 773,235, Oct. 9, 1991, abandoned.

[51] Int. Cl.⁶ .................................................... H03G 5/00
[52] U.S. Cl. ................................................ 381/98; 381/106
[58] Field of Search ................................. 381/22, 98, 106; 333/14

[56] References Cited

U.S. PATENT DOCUMENTS 4,696,044  9/1987  Waller ...................................... 381/106
5,050,217  9/1991  Orban ....................................... 381/106

OTHER PUBLICATIONS

National Semiconductor, AN–74, Jan. 1973, p. 16.

*Primary Examiner*—Forester W. Isen
*Attorney, Agent, or Firm*—Frank J. Catalano; Scott R. Zingerman

[57] ABSTRACT

In a dynamic noise reduction system, the release time versus frequency bandwidth is exponentially related and well beyond that achievable with a simple RC circuit.

A dc control signal is derived from an input audio frequency signal by peak detecting the input signal, filtering the peak detected signal and controlling the release time of the filtered signal so that its release time is fast when the frequency is within a predetermined high range, its release time is moderate when the frequency is within a predetermined intermediate range and its release time is slow when the frequency is within a predetermined low range.

12 Claims, 2 Drawing Sheets

EXPONENTIAL RELEASE CURVE

FREQUENCY BANDWIDTH DEPENDENT EXPONENTIAL RELEASE FOR DYNAMIC FILTER

This is a continuation of application Ser. No. 08/028,763 filed on Mar. 9, 1993, now abandoned, and a continuation of application Ser. No. 07/773,235, filed on Oct. 9, 1991 (abandoned).

BACKGROUND OF THE INVENTION

This invention relates generally to non-complimentary or single-ended noise reduction systems and more particularly concerns the release response characteristics of dynamically controlled filtering circuits used in such systems. A complete dynamic noise reduction system is disclosed in my U.S. Pat. No. 4,696,044. This system has a linear release response characteristic per period of time. Due to the fact that the voltage control filter control law is linear in volts per decade of frequency, the release of this system is relatively linear in time versus decade of filter cut-off frequency. This means that the release time for the filter cut-off to change from 20 KHz to 10 KHz is approximately the same as the release time from 1 KHz to 500 Hz. With a linear release time there is a compromise between audible breathing with a slower release and a lack of ambiance with a fast release.

With typical program material, high-level high-frequency information such as sibilance on vocals is present for a very short period of time, on the order of a few milliseconds, whereas background ambiance and reverb can trail on for up to a few hundred milliseconds. Typically, the high-frequency decay of reverb is very fast. However, the long reverb tail which continues for hundreds of milliseconds contains much mid-frequency information from 500 Hz up to 2 KHz. If a release rate for the dynamic filter is selected to reduce any audible breathing in the high frequency spectrum, i.e., 50 ms for the bandwidth to change from 32 KHz to 4 KHz or 3 decades of frequency, then the mid-band release from 4 KHz to 500 Hz or 3 decades of frequency will also be 50 ms. This will reduce the transparency of the noise reduction system by greatly reducing the perceived openness of the audio signal. Use of a single-pole 6 dB per octave filter helps reduce this effect by providing a gradual cut-off attenuation slope. 12 or 18 dB per octave filtering would obviously provide much more noise reduction capabilities. In the original design, only a small portion of the RC release curve is used and this provides a somewhat linear release or voltage versus time response. It is possible to improve system transparency by exploiting the full exponential release characteristics of a simple RC circuit. With a simple RC circuit designed to provide a 50 ms release from 32 KHz to 4 KHz, the release time from 4 KHz to 500 Hz increases to approximately 200 ms. While this is an improvement it still requires a design compromise between breathing, transparency and filter cut-off slope. To eliminate this compromise, it is desirable to provide a dynamic filter with a non-linear release such that the release time in each specific portion of the audio spectrum is optimized for maximum transparency.

It is, therefore, an object of the present invention to provide a dynamic noise reduction system with a frequency-bandwidth-dependent release having a very fast filter release in the high-frequency spectrum, a moderate release in the upper mid-frequency spectrum, and a very slow release in the lower mid-frequency portion of the audio spectrum. Yet another object of the present invention is to provide a filter control circuit that allows 12 to 18 dB per octave filtering without sacrificing audible transparency or sonic quality.

SUMMARY OF THE INVENTION

In accordance with the invention, a dynamic noise reduction system is provided in which the release time versus frequency bandwidth is exponentially related and well beyond that achievable with a simple RC circuit.

This is accomplished by deriving a dc control signal from an input audio frequency signal by full wave rectifying and log converting the input signal, amplifying the rectified and converted signal, peak detecting the amplified signal, filtering the peak detected signal and controlling the release time of the filtered signal so that its release time is fast when the frequency is within a predetermined high range, its release time is moderate when the frequency is within a predetermined intermediate range and its release time is slow when the frequency is within a predetermined low range.

BRIEF DESCRIPTION OF THE DRAWINGS

Other objects and advantages of the invention will become apparent upon reading the following detailed description and upon reference to the drawings in which.

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION

Figure 1:
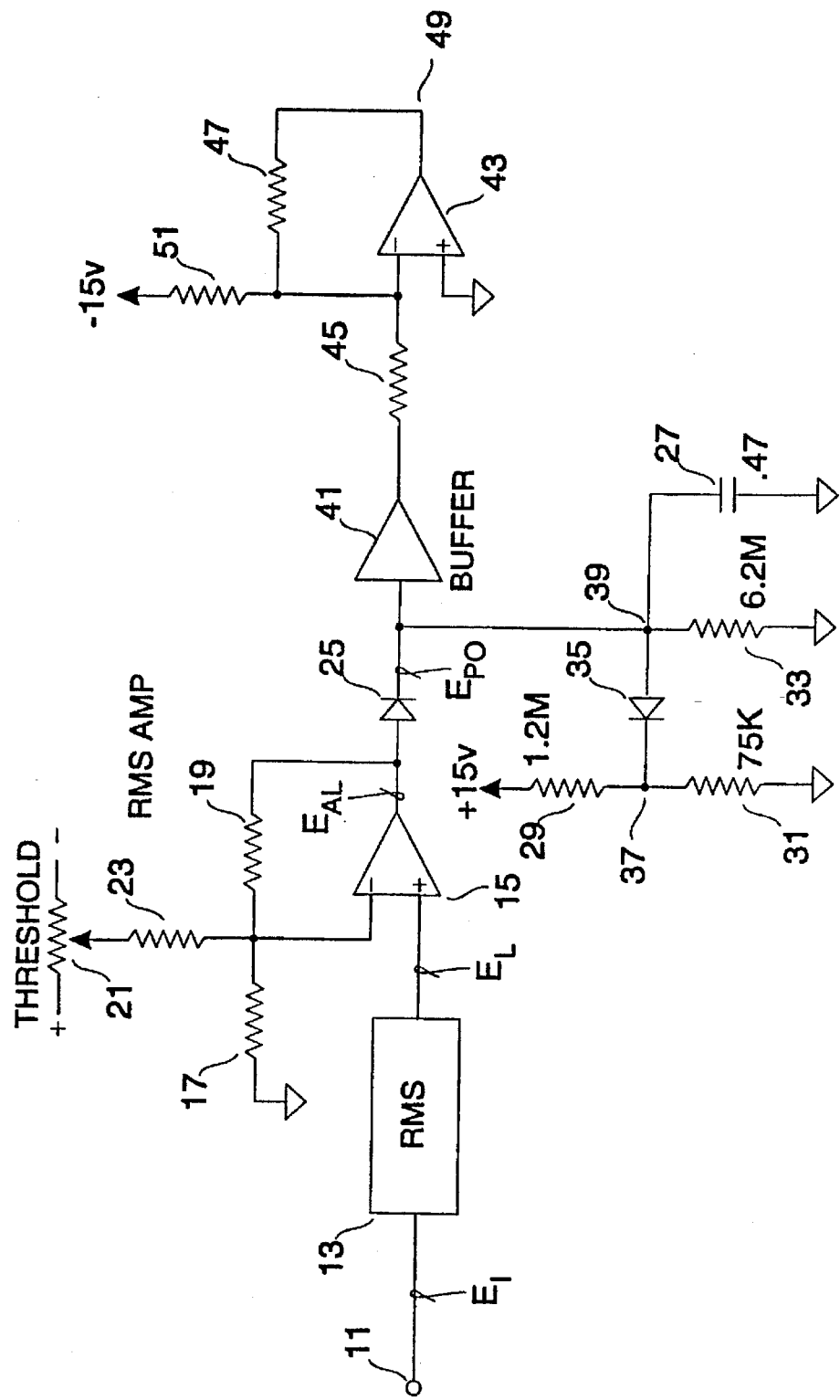
FIG. 1 is a diagram of the preferred embodiment of the invention.

Referring to FIG. 1, input terminal 11 receives the input signal $E_I$ to the detection circuit. A high-pass filtered signal is typically applied at this point, which increases the detection circuit sensitivity to high-frequency information. This process is fully described in my U.S. Pat. No. 4,696,044. An RMS circuit 13 full-wave rectifies and log converts the input signal $E_I$. This logged signal $E_L$ is fed to the non-inverting input of an op-amp 15. The amplifier 15 determines the gain of the log-converted signal by the ratio of resistors 17 and 19, and also allows for adjustment of the threshold point via an adjustable resistor 21 and another resistor 23. The amplified log-converted signal $E_{AL}$ is then peak-detected by a diode 25. This signal $E_{PO}$ is then filtered by a capacitor 27. The time required to discharge the capacitor 27 is determined by several resistors 29, 31, and 33 and another diode 35. The resistors 29 and 31 form a simple voltage divider. From Thevenin's Theorem, this voltage $V_{TH}$ at node 37 is 0.882 volts and the resistance $R_{TH}$ at node 37 is 70588 ohms. If a short term transient appears at the input node 11 which causes the voltage at node 39 to increase to 3 volts, the initial release time will be predominately determined by the voltage divider resistors 29 and 31. Since the voltage $V_{TH}$ at node 37 is nominally 0.882 volts, the second diode 35 will be in forward conduction and the capacitor 27 will discharge at a rate determined by $R_{TH}$ at node 37 in parallel with resistor 33. This equivalent resistance is approximately 69.7K ohms and will provide a very fast initial release. As the voltage at node 39 decreases, the forward voltage versus current characteristics of the diode 35 begin to have an effect and the release time starts to decrease. This will provide a moderate release time. When the voltage at node 139 drops below the forward conduction of the diode 35, the release rate is determined by the time constant of the capacitor 27 and resistor 33. With resistor 33 equal to 6.2M ohms, the final release time will be very slow, on the order of 900 ms.

A buffer amplifier 41, which may have a slight effect on the release time if its input impedance is not extremely high, provides a low impedance output to drive an inverting gain amplifier 43. A pair of resistors 45 and 47 determine the gain of the noninverting amplifier 43 and are selected to provide the proper volt-per-decibel response to control a voltage-controlled filter. The control port of the voltage controlled filter 60 would connect to the output node 49 of the amplifier 43. A resistor 51 provides a positive offset at the output node 49 as would be required to set the quiescent −3 dB point of the voltage controlled filter. Any commonly known VCF could connect to output node 49, such as the one described in my U.S. Pat. No. 4,696,044. While the voltage controlled filter does not have to provide a linear volt-per-decade of frequency control, optimal results may be achieved when a filter with linear control is used.

Figure 2:
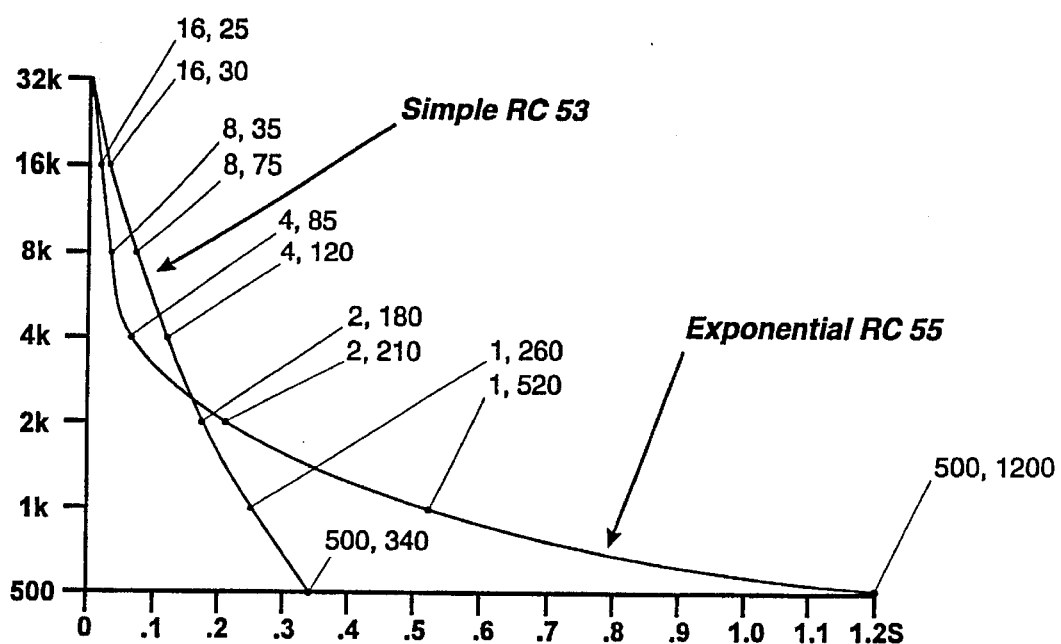
FIG. 2 is a frequency/voltage versus time graph comparing a standard RC circuit with the exponential RC circuit of the present invention.

FIG. 2 compares the release response 53 of a simple RC circuit with the release response 55 of the present exponential RC when a filter with linear control is used. This frequency vs. time graph clearly illustrates how the release response of the present exponential RC circuit 55 differs from that provided by a simple RC circuit 53. When the frequency is above 8 kHz, both circuits 53 and 55 maintain somewhat similar release rates. However, as the frequency drops down below 8 kHz, the release time of the exponential RC circuit 55 increases dramatically for each consecutive octave. The octave from 16 kHz to 8 kHz demonstrates a release time of approximately 35 ms−25 ms=10 ms; the octave from 8 kHz to 4 kHz demonstrates a release time of approximately 85 ms−35 ms=50 ms; the octave from 4 kHz to 2 kHz demonstrates a release time of approximately 210 ms−85 ms=125 ms; the octave from 2 kHz to 1 kHz demonstrates a release time approximately 520 ms−210 ms=310 ms; the octave from 1 kHz to 500 Hz demonstrates a release time of approximately 1200 ms−520 ms =680 ms. Compare this with the simple RC circuit 53 which, in the octave from 16 kHz to 4 kHz demonstrates a release time of approximately 75 ms−30 ms=45 ms; in the octave from 8 kHz to 4 kHz demonstrates a time of approximately 120 ms−75 ms− 45 ms; in the octave from 4 kHz to 2 kHz demonstrates a release time of approximately 260 ms−180 ms=80 ms; in the octave from 2 kHz to 1 kHz demonstrates a release time of approximately 260 ms−180 ms=0 ms: in the octave from 1 kHz to 500 Hz demonstrates a release time of approximately 340 ms−260 ms=80 ms. Clearly, for a simple RC circuit 53 the ratio of per octave release times four octaves apart in the range of 16 kHz to 500 Hz is approximately 1.8. The ratio of per octave release times for the exponential RC circuit 55 for frequencies four octaves apart in the range of 16 kHz to 500 Hz is in the range of approximately 13.6 to 31.0. Moreover, FIG. 2 illustrates that these improvements are achieved without application of the asymptotic extremes of the exponential RC circuit response curve.

Thus, it is apparent that there has been provided, in accordance with the invention, a frequency bandwidth dependent exponential release for a dynamic filter that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A system for deriving a dc control signal from an input audio frequency signal comprising:

means for dynamically filtering said input audio frequency signal to provide an output signal;

means for peak detecting said input signal;

means for filtering said peak detected signal; and means for controlling said dynamically filtering means in response to the release time of said filtered peak detected signal, said controlling means providing a first exponential per octave release time when the cut-off frequency of said dynamic filtering means is within a predetermined high range and a second exponential per octave release time higher than said first exponential per octave release time when the cut-off frequency of said dynamic filtering means is within a predetermined low range, said second exponential per octave release time being at least about 13.6 times said first exponential per octave release time for frequencies four octaves apart in a range of from 16 kHz to 500 Hz.

2. A system for deriving a dc control signal from an input audio frequency signal comprising:

means for dynamically filtering said input audio frequency signal to provide an output signal;

means for full wave rectifying said input signal;

means for peak detecting said rectified signal;

means for filtering said peak detected signal; and means for controlling said dynamically filtering means in response to the release time of said filtered peak detected signal, said controlling means providing a first exponential per octave release time when the cut-off frequency of said dynamic filtering means is within a predetermined high range and a second exponential per octave release time higher than said first exponential per octave release time when the cut-off frequency of said dynamic filtering means is within a predetermined low range, said second exponential per octave release time being at least about 13.6 times said first exponential per octave release time for frequencies four octaves apart in a range of from 16 kHz to 500 Hz.

3. A system for deriving a dc control signal from an input audio frequency signal comprising:

means for dynamically filtering said input audio frequency signal to provide an output signal;

means for full wave rectifying and log converting said input signal;

means for amplifying said rectified and converted signal;

means for peak detecting said amplified signal;

means for filtering said peak detected signal;

means for controlling said dynamically filtering means in response to the release time of said filtered peak detected signal, said controlling means providing a first exponential per octave release time when the cut-off frequency of said dynamic filtering means is within a predetermined high range and a second exponential per octave release time higher than said first exponential per octave release time when the cut-off frequency of said dynamic filtering means is within a predetermined low range, said second exponential per octave release time being at least about 13.6 times said first exponential per octave release time for frequencies four octaves apart in a range of from 16 kHz to 500 Hz.

4. A system according to claim 1, said controlling means comprising:

a first resistive load circuit connected in parallel with said filtering means;

a second resistive load circuit connected in parallel with said first resistive load circuit;

means in said second resistive load circuit for varying the resistance of said second resistive load circuit.

5. A system according to claim 1, said controlling means comprising:

a first resistor connected in parallel with said filtering means;

a diode and a second resistor connected in parallel with said first resistor; and means for biasing said diode for substantially full forward conductance to provide said first exponential per octave release time and for substantially cutting off said conductance to provide said second exponential release time.

6. A method of deriving a dc control signal from an input audio frequency signal comprising the steps of:

dynamically filtering said input audio frequency signal to provide an output signal;

peak detecting said input signal;

filtering said peak detected signal;

adjusting the release time of said filtered peak detected signal to provide a first exponential per octave release time when the cut-off frequency of said dynamically filtered signal is within a predetermined high range and a second exponential per octave release time higher than said first exponential per octave release time when the cut-off frequency of said dynamically filtered signal is within a predetermined low range, said second exponential per octave release lime being at least 13.6 times said first exponential per octave release time for frequencies four octaves apart in a range of from 16 kHz to 500 Hz; and using the adjusted peak detected signal to control said dynamic filtering.

7. A method of deriving a dc control signal from an input audio frequency signal comprising the steps of:

dynamically filtering said input audio frequency signal to provide an output signal;

full wave rectifying said input signal;

peak detecting said rectified signal;

filtering said peak detected signal;

adjusting the release time of said filtered peak detected signal to provide a first exponential per octave release time when the cut-off frequency of said dynamically filtered signal is within a predetermined high range and a second exponential per octave release time higher than said first exponential per octave release time when the cut-off frequency of said dynamically filtered signal is within a predetermined low range, said second exponential per octave release time having at least about 13.6 times said first exponential per octave release time for frequencies four octaves apart in a range of from 16 kHz to 500 Hz; and using the adjusted peak detected signal to control said dynamic filtering.

8. A method of deriving a dc control signal from an input audio frequency signal comprising the steps of:

dynamically filtering said input audio frequency signal to provide an output signal;

full wave rectifying and log converting said input signal;

amplifying said rectified and converted signal;

peak detecting said amplified signal;

filtering said peak detected signal;

adjusting the release time of said filtered peak detected signal to provide a first exponential per octave release time when the cut-off frequency of said dynamically filtered signal is within a predetermined high range and a second exponential per octave release time higher than said first exponential per octave release time when the cut-off frequency of said dynamically filtered signal is within a predetermined low range, said second exponential per octave release time being at least about 13.6 times said first exponential per octave release time for frequencies four octaves apart in a range of from 16 kHz to 500 Hz; and using the adjusted peak detected signal to control said dynamic filtering.

9. A system for deriving a dc control signal from an input audio frequency signal comprising:

means for dynamically filtering said input audio frequency signal to provide an output signal;

means for peak detecting said input signal;

means for filtering said peak detected signal; and means for controlling said dynamically filtering means in response to the release time of said filtered peak detected signal, said controlling means providing a first exponential per octave release time when the cut-off frequency of said dynamic filtering means is within a predetermined high range, a second exponential per octave release time higher than said first exponential per octave release time when the cut-off frequency of said dynamic filtering means is within a predetermined intermediate range and a third exponential per octave release time higher than said second exponential per octave release time when the cut-off frequency of said dynamic filtering means is within a predetermined low range, said third exponential per octave release time being at least about 13.6 times said first frequencies four octaves apart in a range of from 16 kHz to 500 Hz.

10. A system according to claim 9, said controlling means comprising:

a first resistive load circuit connected in parallel with said filtering means;

a second resistive load circuit connected in parallel with said first resistive load circuit; and means in said second resistive load circuit for varying the resistance of said second resistive load circuit.

11. A system according to claim 9, said controlling means comprising:

a first resistor connected in parallel with said filtering means;

a diode and a second resistor connected in parallel with said first resistor; and means for biasing said diode for substantially full forward conductance to provide said first exponential per octave release time, for decreasing said conductance to provide said second exponential release time and for substantially cutting off said conductance to provide said third exponential release time.

12. A method of deriving a dc control signal from an input audio frequency signal comprising the steps of:

dynamically filtering said input audio frequency signal to provide an output signal;

peak detecting said input signal;

filtering said peak detected signal;

adjusting the release time of said filtered peak detected signal to provide a first exponential per octave release time when the cut-off frequency of said dynamically filtered signal is within a predetermined high range, a second exponential per octave release time higher than said first exponential per octave release time when said cut-off frequency of said dynamically filtered signal is within a predetermined intermediate range and a third exponential per octave release time higher than said second exponential per octave release time when the cut-off frequency of said dynamically filtered signal is within a predetermined low range, said third exponential per octave release time being at least about 13.6 times said first exponential per octave release time for frequencies four octaves apart in a range of from 16 kHz to 500 Hz; and using the adjusted peak detected signal to control said dynamic filtering.

* * * * *